(12) United States Patent
Baek et al.

(10) Patent No.: US 9,559,230 B2
(45) Date of Patent: Jan. 31, 2017

(54) SOLAR CELL AND METHOD FOR MANUFACTURING SAME

(75) Inventors: Chang Ki Baek, Pohang-si (KR); Yoon Ha Jeong, Pohang-si (KR); Seong Wook Choi, Seoul (KR); Tai Uk Rim, Pohang-si (KR); Soo Young Park, Seoul (KR); Myung Dong Ko, Busan (KR)

(73) Assignee: POSTECH ACADEMY—INDUSTRY FOUNDATION, Gyeongsangbuk-do (KR)

( * ) Notice: Subject to any disclaimer, the term of this patent is extended or adjusted under 35 U.S.C. 154(b) by 209 days.

(21) Appl. No.: 14/239,693

(22) PCT Filed: Aug. 17, 2012

(86) PCT No.: PCT/KR2012/006563
§ 371 (c)(1),
(2), (4) Date: Jun. 16, 2014

(87) PCT Pub. No.: WO2013/027975
PCT Pub. Date: Feb. 28, 2013

(65) Prior Publication Data
US 2014/0326305 A1    Nov. 6, 2014

(30) Foreign Application Priority Data
Aug. 19, 2011    (KR) .................. 10-2011-0083105

(51) Int. Cl.
*H01L 31/0352*    (2006.01)
*H01L 31/18*    (2006.01)
(Continued)

(52) U.S. Cl.
CPC . *H01L 31/035227* (2013.01); *H01L 31/02327* (2013.01); *H01L 31/022466* (2013.01);
(Continued)

(58) Field of Classification Search
USPC .......................... 136/252, 256, 255
See application file for complete search history.

(56) References Cited

U.S. PATENT DOCUMENTS

2007/0290197 A1*  12/2007  Firon ............... B82Y 10/00
                                                          257/40
2008/0006319 A1    1/2008  Bettge et al.
(Continued)

FOREIGN PATENT DOCUMENTS

JP    2008-177539 A    7/2008
KR    10-103302 B1    12/2010
(Continued)

OTHER PUBLICATIONS

International Search Report and Written Opinion for PCT/KR2012/006563 dated Jan. 14, 2013, 9 pages.

*Primary Examiner* — Susan D Leong
(74) *Attorney, Agent, or Firm* — James F. Ewing; Foley & Lardner LLP

(57) ABSTRACT

Disclosed are a solar cell and a method for manufacturing the same. The solar cell comprises asymmetric nanowires each of which has an angled sidewall, and thus incident light can be concentrated at a p-n junction portion by means of a total reflection phenomenon of light caused by the difference between the refractive indices of a semiconductor layer and a transparent electrode layer, and light absorption may increase due to an increase in the light travel distance, thus improving photoelectric efficiency. Further, the method for manufacturing the solar cell involves etching a substrate and integrally forming the substrate and a p-type semiconductor layer including the asymmetric nanowires each of which has the angled sidewalls, thereby enabling reduced manufacturing costs and simple and easy manufacture of the nanowires having the angled sidewalls.

17 Claims, 10 Drawing Sheets

(51) Int. Cl.
  *H01L 31/068*     (2012.01)
  *H01L 31/0224*    (2006.01)
  *H01L 31/0232*    (2014.01)
  *H01L 31/054*     (2014.01)

(52) U.S. Cl.
  CPC .. *H01L 31/035281* (2013.01); *H01L 31/0547* (2014.12); *H01L 31/068* (2013.01); *H01L 31/18* (2013.01); *Y02E 10/52* (2013.01); *Y02E 10/547* (2013.01)

(56) References Cited

U.S. PATENT DOCUMENTS

| | | |
|---|---|---|
| 2008/0135089 A1 | 6/2008 | Tsakalakos et al. |
| 2009/0020150 A1* | 1/2009 | Atwater ............... H01G 9/2054 136/246 |
| 2010/0319758 A1* | 12/2010 | Ikuno ................. H01L 31/0296 136/252 |
| 2011/0083728 A1 | 4/2011 | Street et al. |
| 2011/0240104 A1 | 10/2011 | Lee et al. |
| 2012/0168713 A1* | 7/2012 | Lee ....................... B82Y 30/00 257/9 |

FOREIGN PATENT DOCUMENTS

| | | |
|---|---|---|
| WO | WO-2010/067958 | 6/2010 |
| WO | WO-2010/144274 | 12/2010 |

* cited by examiner

SOLAR CELL AND METHOD FOR MANUFACTURING SAME

CROSS-REFERENCE TO RELATED APPLICATIONS

This application claims the benefit of priority as a national stage application under 35 U.S.C. 371 to International Application No. PCT/KR2012/006563, filed on Aug. 17, 2012, which claims the benefit of priority to Korean Application 10-2011-0083105, filed on Aug. 19, 2011, each of which is incorporated herein by reference in its entirety.

TECHNICAL FIELD

The present invention relates to a solar cell and a method of manufacturing the same. More specifically, the present invention relates to a nanowire-based solar cell and a method of manufacturing the same.

BACKGROUND ART

Since the Kyoto Protocol was adopted in December, 1997 in order to limit emissions of carbon dioxide which is a major reason for global warming, studies on a renewable and clean alternative energy source, such as solar energy, wind energy, and hydroelectric energy, have been actively conducted.

Among them, solar cells are attracting attention as a source of alternative energy. A solar cell is a device which converts solar energy into electric energy using a semiconductor device. Solar cells may be divided into an inorganic solar cell, a dye-sensitized solar cell, and an organic solar cell according to a material of a photoactive layer constituting the solar cell.

Currently, bulk type crystalline Si solar cells, which are a kind of inorganic solar cells, are used in most cases.

Generally, a silicon solar cell has a p-n junction structure formed in such a way that a p-type semiconductor layer is in contact with an n-type semiconductor layer. When this kind of solar cell is irradiated with light, excited electron-hole pairs, i.e., "excitons" are formed by the incident light. The excitons diffuse in an arbitrary direction to be separated into electrons and holes by an electric field generated in the p-n junction. At this time, the separated electrons move to the n-type semiconductor layer, holes move to the p-type semiconductor layer, and thus currents flow.

The electrons and holes recombine after a period of time after separation. Here, time taken for electrons or holes to recombine after they are generated is referred to as a carrier lifetime, and a distance over which electrons or holes travel until they recombine is referred to as a diffusion length.

As an example, a carrier lifetime of silicon is about 1 μs, and a diffusion length is about 100 μm to 300 μm.

However, the silicon solar cell has problems such as low photoelectric efficiency caused by optical loss in a surface of the solar cell, loss due to resistance of an electrode that collect electrons or holes, loss due to recombination of charges, etc. Accordingly, development of solar cells having high efficiency is required.

In order to increase efficiency of a solar cell, it is desirable to maximize a light incident area and a p-n junction area in which excitons are separated in a limited volume of a device. In addition, it is desirable to transfer electrons and holes to an electrode with less loss by reducing a diffusion distance in order to prevent electron-hole recombination.

Meanwhile, a nanowire has a high ratio of volume to area due to its one-dimensional structural characteristics. Accordingly, in a solar cell including the nanowire as a photoactive layer, diffusely reflected sunlight is likely to be re-incident on the device, and the direction in which electrons and holes can travel is limited to one direction. Thus, an average diffusion length of electrons and holes is reduced, which causes reduction in probability of loss of electrons and holes, resulting in increase of photoelectric efficiency of the solar cell.

FIG. 1 is a perspective view showing an existing nanowire-based solar cell.

Referring to FIG. 1, the existing nanowire-based solar cell includes a substrate 10, a plurality of silicon nanowires 20 perpendicularly arranged at constant intervals on the substrate 10, an insulating layer 30 filling between the nanowires, and electrodes 40 and 50 for connection to the outside.

The silicon nanowire 20 has a radial structure in which a p-type semiconductor layer 22, an n-type semiconductor layer 24, and a transparent electrode layer 26 are sequentially stacked from the inside. However, in the radial structure, since most of perpendicularly incident sunlight passes through areas other than a p-n junction portion at which the p-type semiconductor layer 22 is in contact with the n-type semiconductor layer 24, probability of photoelectric conversion is low, and thus improvement of photoelectric efficiency is limited.

DISCLOSURE

Technical Problem

An objective of the present invention is to provide a solar cell having an improved structure in which perpendicularly incident sunlight is trapped with high efficiency, and a method of manufacturing the same.

Technical Solution

According to an aspect of the present invention, there is provided a solar cell. The solar cell includes a substrate having a back surface electrode disposed on one surface thereof, a p-type semiconductor layer disposed on the other surface of the substrate and including a plurality of nanowires arranged to be spaced apart in a direction perpendicular to the substrate, an n-type semiconductor layer disposed on the p-type semiconductor layer along surfaces of the plurality of nanowires, a front surface electrode disposed on the n-type semiconductor layer, and an insulating layer formed to cover the n-type semiconductor layer and configured to fill between the plurality of nanowires. Each of the plurality of nanowires have an inclined sidewall.

Each of the plurality of nanowires may have an inverted conical or inverted truncated conical structure of which a diameter decreases from a top toward a bottom.

Each of the plurality of nanowires may have a sandglass- or diamond-shaped structure in which an inverted conical or inverted truncated conical structure with a diameter decreasing from a top toward a bottom is combined with a conical or truncated conical structure with a diameter increasing from a top toward a bottom.

The sidewall of each of the plurality of nanowires forms an angle of about 15° to 90° with a horizontal plane. An interval between the nanowires may be about 15 nm to 10 μm.

A transparent electrode layer located on the n-type semiconductor layer may be further included.

The substrate and the p-type semiconductor layer may be formed as a unibody structure. The substrate and the p-type semiconductor layer may contain p-type silicon.

According to another aspect of the present invention, there is provided a method of manufacturing a solar cell. The method includes providing a substrate, forming a p-type semiconductor layer including a plurality of nanowires having inclined sidewalls on the substrate, forming an n-type semiconductor layer on the p-type semiconductor layer along surfaces of the plurality of nanowires, forming a front surface electrode on the n-type semiconductor layer, and a back surface electrode on a back surface of the substrate, and forming an insulating layer configured to fill spaces between the plurality of nanowires on the n-type semiconductor layer.

Each of the plurality of nanowires may be formed to have an inverted conical or inverted truncated conical structure of which a diameter decreases from a top toward a bottom.

The p-type semiconductor layer may be formed as a unibody structure with the substrate by etching the substrate. The p-type semiconductor layer may be formed to include the plurality of nanowires having inclined sidewalls by anisotropically etching the substrate.

The forming of the p-type semiconductor layer may include forming a nanowire pattern on the substrate, and forming a hardmask on the nanowire pattern and etching the substrate along the nanowire pattern.

The forming of the nanowire pattern on the substrate may be performed using one selected from electron beam lithography, ion beam lithography, X-ray lithography, ultraviolet lithography, photolithography, and nano imprint lithography.

The method may further include forming a transparent electrode layer on the n-type semiconductor layer, after forming the n-type semiconductor layer on the p-type semiconductor layer along surfaces of the plurality of nanowires.

Advantageous Effects

According to embodiments of the present invention, incident light is concentrated at a p-n junction portion using total reflection of light caused by difference in refractive indices between a semiconductor layer and a transparent electrode layer. Accordingly, light absorption increases as light travel distance increases, and thus photoelectric efficiency can be improved.

In addition, a p-type semiconductor layer is formed by etching a p-type substrate with a constant thickness. Thereby, nanowires having various shapes of angled sidewall structures can be manufactured at reduced manufacturing costs, by a simple and easy process.

Technological effects of the present invention should not be construed as limited to the mentioned above. Rather, other technological effects are apparently understood by those skilled in the art from the following embodiments of the present invention.

BEST MODE FOR CARRYING OUT THE INVENTION

Figure 1:
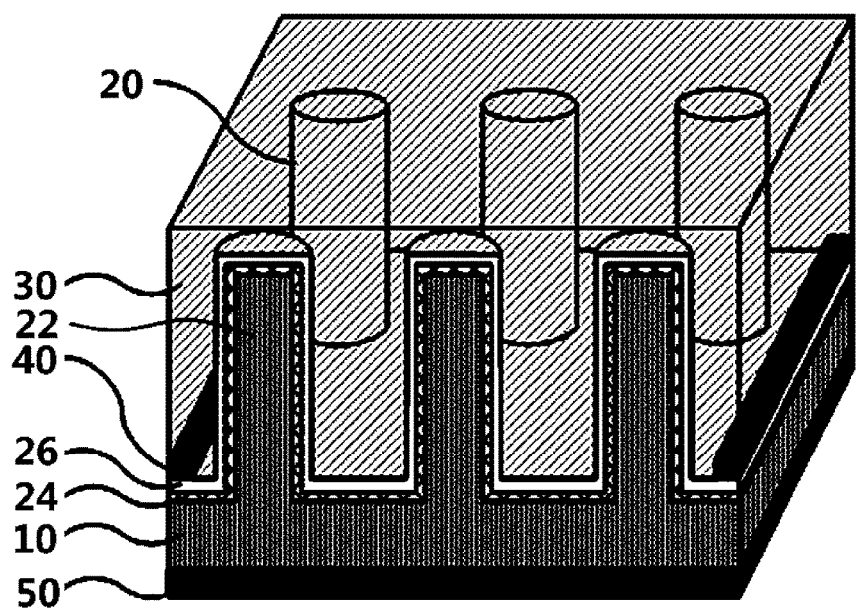
FIG. 1 is a perspective view showing an existing nanowire-based solar cell.

Example embodiments of the present invention are disclosed herein. However, specific structural and functional details disclosed herein are merely representative for purposes of describing example embodiments of the present invention, and thus example embodiments of the present invention may be embodied in many alternate forms and should not be construed as limited to example embodiments of the present invention set forth herein.

It will be understood that when a layer is referred to as being "on" another layer or a substrate, the layer may be formed directly on the other layer or the substrate, or an intervening layer may exist between the layer and the other layer or the substrate. Furthermore, throughout this disclosure, directional terms such as "upper," "upper (portion)," and "upper surface" may also encompass meanings of "lower," "lower (portion)," and "lower surface." That is, a spatial direction is construed as a relative direction, instead of an absolute direction.

In the drawings, the thicknesses of layers and regions may be exaggerated or omitted for clarity. Like numerals refer to like elements throughout the description of the figures.

Figure 2A:
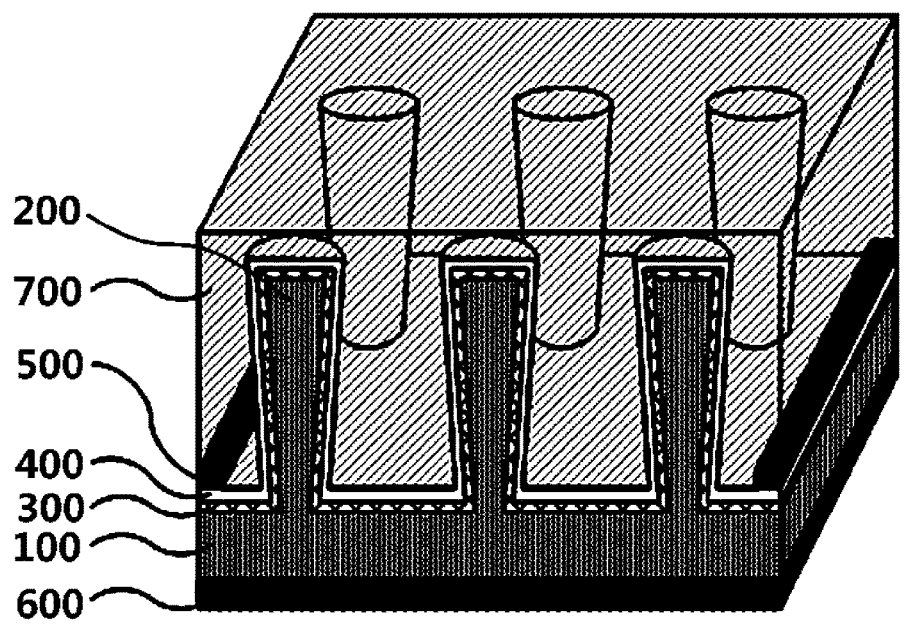
FIG. 2A is a perspective view showing a solar cell in accordance with an embodiment of the present invention.

FIG. 2A is a perspective view showing a solar cell in accordance with an embodiment of the present invention.

Figure 2B:
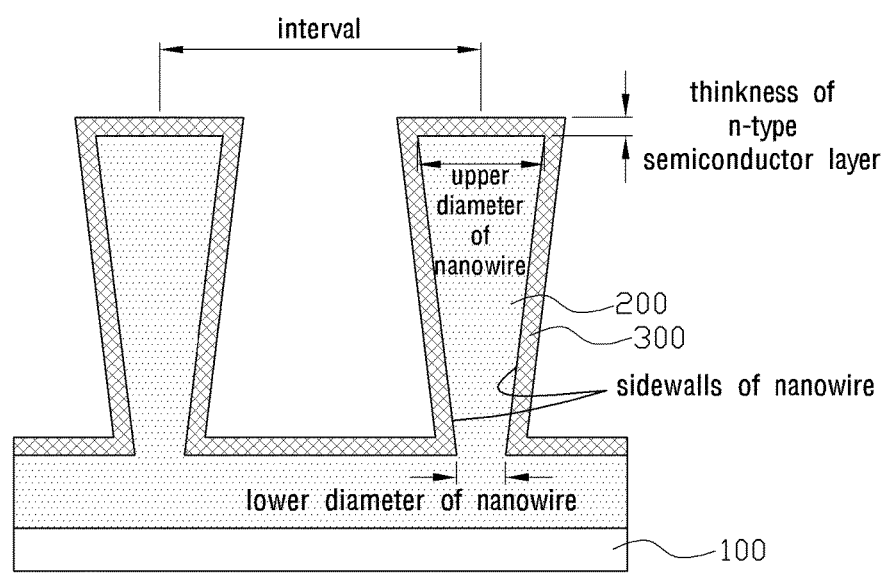
FIG. 2B is a cross-sectional view of a nanowire in accordance with an embodiment of the present invention.

FIG. 2B is a cross-sectional view of a nanowire in accordance with an embodiment of the present invention.

Referring to FIGS. 2A and 2B, a solar cell in accordance with an embodiment of the present invention includes a substrate 100, a p-type semiconductor layer 200 located on the substrate 100, an n-type semiconductor layer 300 located on the p-type semiconductor layer 200, a transparent electrode layer 400 located on the n-type semiconductor layer 300, a front surface electrode 500 located on the transparent electrode layer 400, a back surface electrode 600 located on a surface of the substrate 100, and an insulating layer 700 located on the entire transparent electrode layer 400. However, the transparent electrode layer 400 employed in this embodiment is not an essential element of the present invention and may be excluded in some cases.

The substrate 100 may be a p-type silicon substrate doped with impurities at high concentration. Here, the impurities may be selected from Group III elements. For example, the Group III elements may be B, Al, Ga, etc. The substrate 100 may be a single- or poly-crystalline silicon substrate.

The p-type semiconductor layer 200 may include a plurality of nanowires 200 located on the substrate 100. That is, the p-type semiconductor layer 200 may include a plurality of nanowires 200 substantially perpendicularly arranged at regular intervals on the substrate 100.

Since the p-type semiconductor layer 200 is formed of p-type silicon, the substrate 100 may be used. That is, the p-type semiconductor layer 200 may be formed as a unibody structure with the substrate 100. The p-type semiconductor layer 200 may be formed by etching an upper portion of the substrate 100 in the form of nanowires.

The n-type semiconductor layer 300 is located on the p-type semiconductor layer 200. The n-type semiconductor layer 300 may be formed along surfaces of the plurality of nanowires 200. As an example, the n-type semiconductor layer 300 may be an n-type silicon layer doped with impurities. The impurities may be selected from Group V elements. As an example, the Group V element may be P, As, Sb, etc. The thickness of the n-type semiconductor layer 300 may be preferably 10 nm to 500 nm.

A p-n junction is formed at an interface between the p-type semiconductor layer 200 and the n-type semiconductor layer 300. When sunlight is radiated, the p-n junction absorbs photon to generate an electron-hole pair and separates the electron-hole pair to be transferred to the front surface electrode 500 and the back surface electrode 600, respectively.

A sidewall of each of the plurality of nanowires 200 may have an inclination. That is, the sidewall of each of the plurality of nanowires 200 may have a constant gradient. As an example, the plurality of nanowires 200 may be formed in such a way that a width thereof decreases from a top toward a bottom, and thus have an inverted conical or inverted truncated conical structure in which an upper diameter is greater than a lower diameter.

The upper diameter and the lower diameter of each of the plurality of nanowires 200 are selected from a range of from 5 nm to 1 µm in such a way that the upper diameter is greater than the lower diameter.

In particular, when the upper diameter and the lower diameter are 20 nm or less, a band-gap may increase due to a quantum effect according to proximity to the bottom of the nanowires 200 of which the diameter decreases, and thereby a gap from a sub-band level may increase. Accordingly, since electron-hole recombination is reduced, photoelectric efficiency can be improved.

An interval between the plurality of nanowires 200 is preferably 15 nm to 10 µm. Here, the interval between the nanowires refers to a distance from a nanowire to a neighboring nanowire.

When perpendicularly incident sunlight is sequentially incident on the n-type semiconductor layer 300 having a relatively greater refractive index and the transparent electrode layer 400 or insulating layer 700 having a relatively smaller refractive index around the interface between the n-type semiconductor layer 300 and the transparent electrode layer 400 or insulating layer 700, total reflection in which 100% of light is reflected may occur due to the inclination of the sidewall of each of the plurality of nanowires 200. Accordingly, since the incident sunlight is concentrated at the p-n junction portion located in the vicinity of the lower portion of the nanowire 200, and the travel distance of light increases, photoelectric efficiency can be improved.

An intrinsic semiconductor layer (not shown) may be interposed between the p-type semiconductor layer 200 and the n-type semiconductor layer 300. The intrinsic semiconductor layer may be an intrinsic silicon layer in which p-type or n-type impurities are not doped. As an example, the intrinsic semiconductor layer may be preferably hydrogenated amorphous silicon layer (α-Si:H).

The transparent electrode layer 400 may be further disposed on the n-type semiconductor layer 300. The transparent electrode layer 400 may be formed on the entire n-type semiconductor layer 300. Accordingly, the transparent electrode layer 400 may be formed to surround front or top surfaces of the plurality of nanowires 200.

The transparent electrode layer 400 may function as an electron transfer pathway and an anti-reflection layer. The transparent electrode layer 400 may be preferably formed of a conductive material having translucency. The transparent electrode layer 400 may be formed of one selected from a carbon allotrope, a transparent conductive oxide, and a metal. As an example, the carbon allotrope may be graphene, carbon nanotube, etc. In addition, the transparent conductive oxide may be indium tin oxide (ITO), Al-doped ZnO (AZO), Ga-doped ZnO (GZO), In-doped ZnO (IZO), etc. The metal may be Al, Pt, Ti, etc.

The front surface electrode 500 may be formed on a part of the transparent electrode layer 400. The front surface electrode 500 may be arranged for connection with an external circuit. The front surface electrode 500 may be electrically connected to the transparent electrode layer 400. Two or more front surface electrodes 500 may be arranged to be apart from each other at an interval.

The front surface electrode 500 may be formed of a metal having excellent conductivity or an alloy thereof. As an example, the front surface electrode 500 may be formed of at least one selected from Al, Ag, Ni, Cu, Ti, Pd, Cr, and W, and an alloy thereof.

The back surface electrode 600 may be formed on a back surface of the substrate 100. The back surface electrode 600 may be arranged for connection with an external circuit. The back surface electrode 600 may be electrically connected to the substrate 100. The back surface electrode 600 may include the same metal or alloy thereof as the front surface electrode 500.

The insulating layer 700 may be formed to cover the transparent electrode layer 400 and the front surface electrode 500. The insulating layer 700 may fill the region between the plurality of nanowires 200. Thereby, the insulating layer 700 supports and fixes the plurality of nanowires 200 to maintain structural stability of a device.

The insulating layer 700 may be a transparent insulating layer. As an example, the insulating layer 700 may be a silicon oxide layer, a silicon nitride layer, or a double layer thereof. However, the present invention is not limited thereto, and any material as long as it has transparency and serves as a passivation layer can be used.

A separate anti-reflection layer (not shown) may be further located on the insulating layer 700 in order to prevent reflection of light.

Figure 3A:
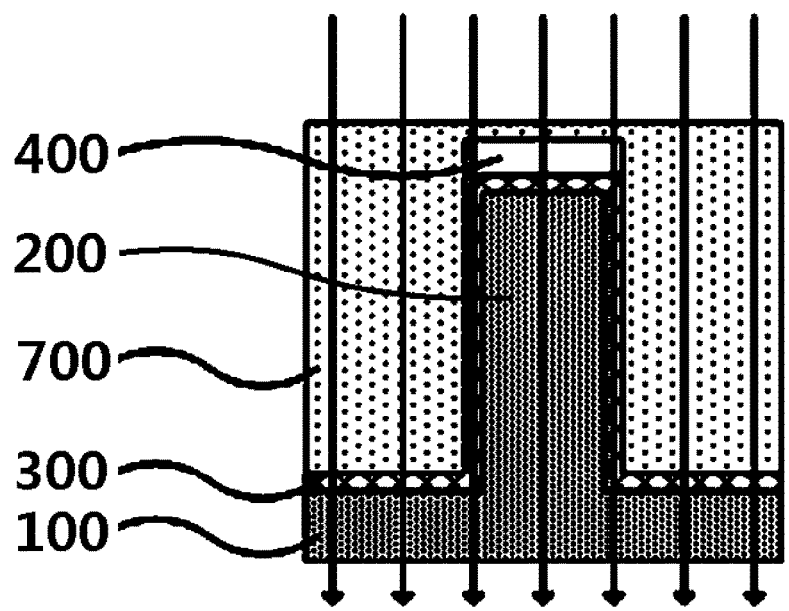
FIG. 3A is a schematic diagram showing reflection of sunlight perpendicularly incident on an existing nanowire-based solar cell.

FIG. 3A is a schematic diagram showing reflection of sunlight perpendicularly incident on an existing nanowire-based solar cell.

Referring to FIG. 3A, the existing nanowire-based solar cell includes a plurality of cylindrical nanowires 200 of which a sidewall is not tilted. Accordingly, most of perpendicularly incident sunlight passes through areas other than a p-n junction portion in which generation and separation of electron-hole pairs occur due to the linearity of light. Accordingly, probability of recombination of separated electrons or holes increases, which leads to reduction of photoelectric efficiency.

Figure 3B:
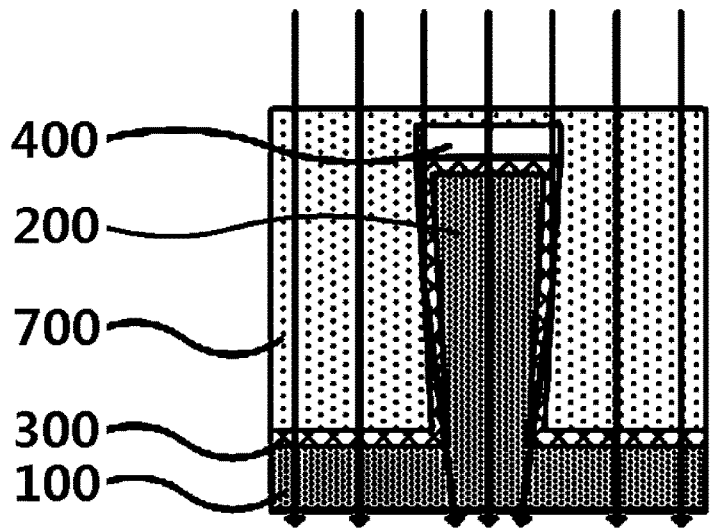
FIG. 3B is a schematic diagram showing reflection of sunlight perpendicularly incident on a solar cell in accordance with an embodiment of the present invention.

FIG. 3B is a schematic diagram showing reflection of sunlight perpendicularly incident on a solar cell in accordance with an embodiment of the present invention.

Referring to FIG. 3B, the solar cell in accordance with the embodiment of the present invention may have an inverted conical or inverted truncated conical structure of which a diameter of a nanowire 200 decreases from a top toward a bottom. That is, the nanowire 200 may have a sidewall inclined at an angle with respect to a perpendicular direction. Accordingly, when sunlight is perpendicularly incident, since the light is incident from the n-type semiconductor layer 300 having a high refractive index to the transparent electrode layer 400 or the insulating layer 700 having a low refractive index, 100% of light may be reflected without being refracted. That is, total reflection of light may occur. In this case, the incident sunlight may be concentrated at a p-n junction portion located in the vicinity of the lower portion of the nanowire 200.

Figure 4A:
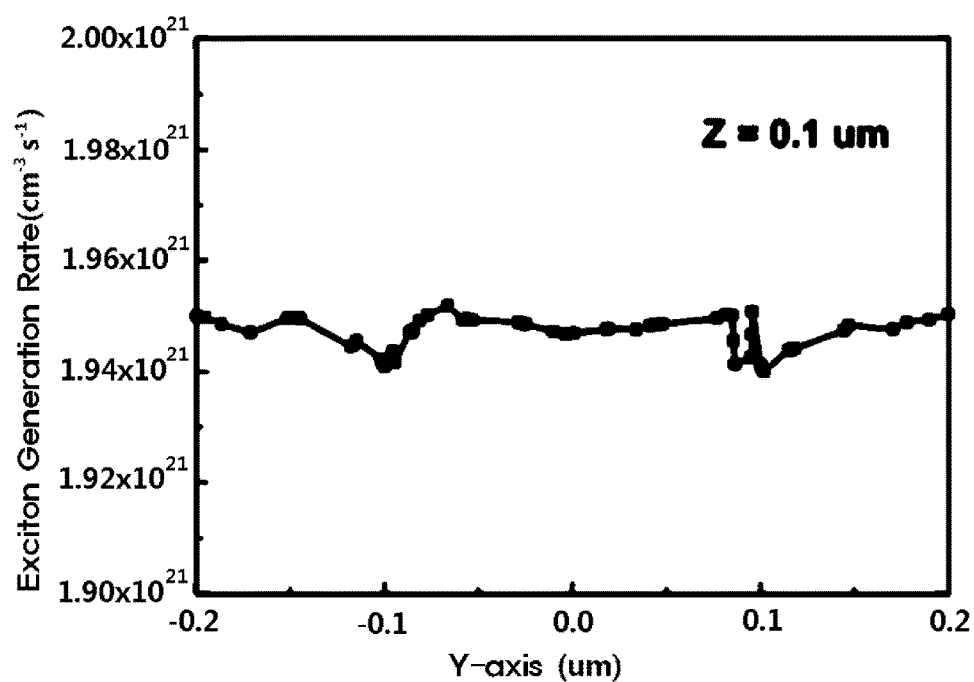
FIG. 4A is a graph showing a rate of generation of electron-hole pairs (excitons) when sunlight is perpendicularly incident on an existing nanowire-based solar cell.

FIG. 4A is a graph showing a rate of generation of electron-hole pairs (excitons) when sunlight is perpendicularly incident on an existing nanowire-based solar cell.

Figure 4B:
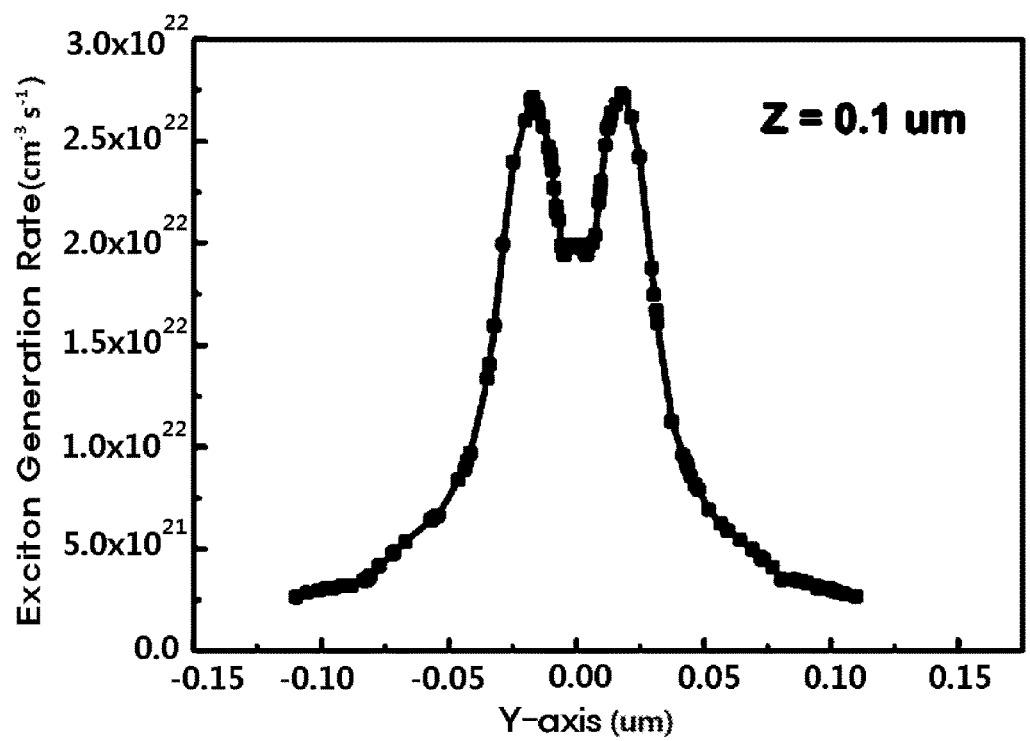
FIG. 4B is a graph showing a rate of generation of electron-hole pairs (excitons) when sunlight is perpendicularly incident on a solar cell in accordance with an embodiment of the present invention.

FIG. 4B is a graph showing a rate of generation of electron-hole pairs (excitons) when sunlight is perpendicularly incident on a solar cell in accordance with an embodiment of the present invention.

Referring to FIGS. 4A and 4B, in the case of an existing nanowire-based solar cell, generated excitons are distributed inversely proportional to the distance of incidence and distributed substantially evenly in the entire device. On the contrary, in the case of a solar cell in accordance with an embodiment of the present invention, generated excitons are intensively distributed in the p-n junction portion in the vicinity of the lower portion of the nanowire due to total reflection of light.

In this case, since recombination of electron-hole pairs is reduced due to an effect of electric field applied near the p-n junction and a quantum effect according to a diameter of the nanowire, a photoelectric effect may increase.

Figure 5A:
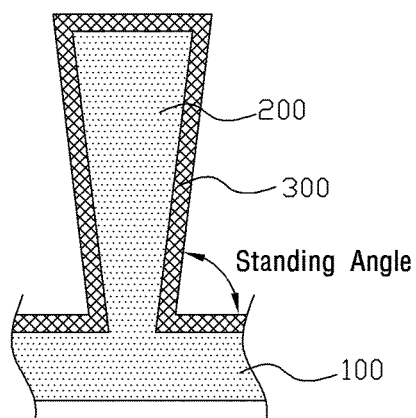
FIG. 5A is a view showing an angle (standing angle) which a sidewall of a nanowire forms with respect to a horizontal plane in a solar cell in accordance with an embodiment of the present invention.

FIG. 5A is a view showing an angle (standing angle) which a sidewall of a nanowire forms with a horizontal plane in a nanowire-based solar cell in accordance with an embodiment of the present invention.

Figure 5B:
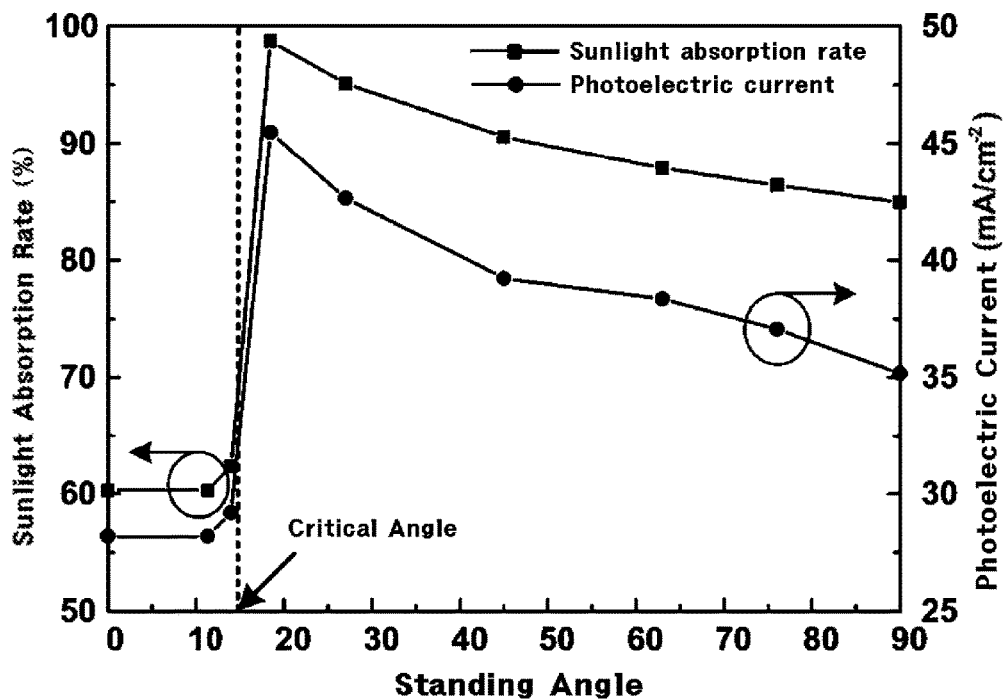
FIG. 5B is a graph showing a sunlight absorption rate and a generated current according to a standing angle in a solar cell in accordance with an embodiment of the present invention.

FIG. 5B is a graph showing a sunlight absorption rate and a generated current according to a standing angle in a solar cell in accordance with an embodiment of the present invention.

Referring to FIGS. 5A and 5B, an angle that a horizontal plane and a sidewall of a nanowire form is defined as a standing angle. Accordingly, in the case of a cylindrical nanowire having the same top and bottom diameters, the standing angle is about 90°, the light absorption rate is about 85%, and current values are about 35 mA/cm$^{-2}$. On the other hand, it is found that, as the standing angle becomes smaller than 90°, that is, as the standing angle decreases, the light absorption rate and currents increase. It can be interpreted that incident sunlight travels farther in the nanowire since the incident sunlight is totally reflected as a standing angle decreases.

However, when the standing angle is smaller than 15° which is a critical angle for total reflection, the solar cell in accordance with an embodiment of the present invention rather shows a lower light absorption rate and a lower current value than the existing nanowire-based solar cell since incident sunlight is scattered to the outside of the nanowire.

Accordingly, the sidewall of the nanowire needs to be designed to have a gradient greater than or the same as a critical angle so as to generate total reflection of incident sunlight. Accordingly, the angle that the sidewall of the nanowire forms with the horizontal plane is preferably selected from the range of about 15° to 90°. That is, a gradient of the sidewall of the nanowire may be adjusted so that the standing angle is within the range of about 15° to 90°.

FIGS. 6A to 6H are process flow diagrams showing a method of manufacturing a solar cell in accordance with an embodiment of the present invention.

Figure 6A:
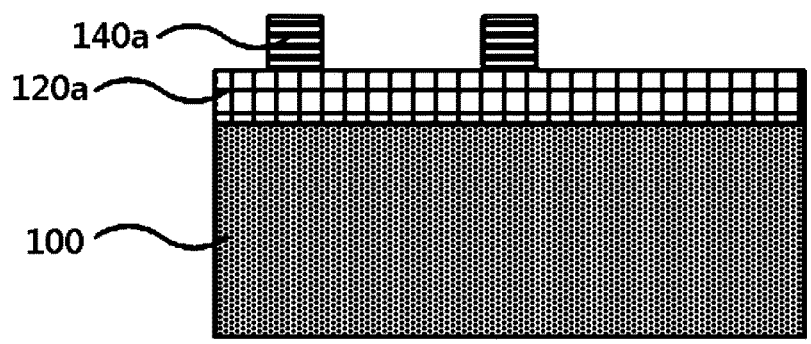
FIGS. 6A to 6H are process flow diagrams showing a method of manufacturing a solar cell in accordance with an embodiment of the present invention.

Referring to FIG. 6A, a first hardmask 120a is deposited on a substrate 100. As an example, the substrate 100 may be a p-type silicon substrate doped with impurities at high concentration. The first hardmask 120a may be a silicon oxide layer or a silicon nitride layer. A nanowire pattern is formed on the substrate 100 by disposing a photoresist pattern 140a on a part of the first hardmask 120a.

The first hardmask 120a may be formed using sputtering or chemical vapor deposition. The photoresist pattern 140a may be formed using electron beam lithography, ion beam lithography, X-ray lithography, ultraviolet lithography, photolithography, or nano imprint lithography.

Figure 6B:
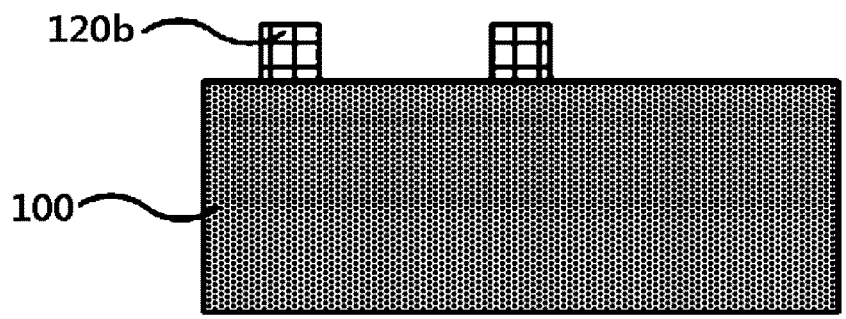

Referring to FIG. 6B, a second hardmask 120b is formed on the substrate 100, using the photoresist pattern 140a of FIG. 6A. The second hardmask 120b may be used as an etch mask for etching the substrate 100.

The second hardmask 120b may be a silicon oxide layer or a silicon nitride layer. As an example, the second hardmask 120b may be formed using sputtering, chemical vapor deposition, etc. Here, a specific area may be masked using a normal photolithography and etching process.

Figure 6C:
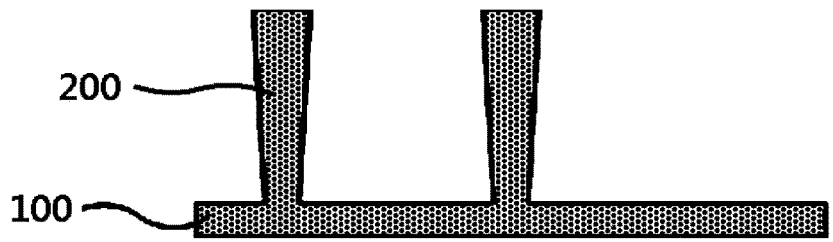

Referring to FIG. 6C, a p-type semiconductor layer 200 is formed by etching the substrate 100 using the second hardmask 120b as an etch mask. The p-type semiconductor layer 200 may include a plurality of nanowires 200 having inclined sidewalls.

Here, the etching process may be a dry or wet etching process. As an example, the plurality of nanowires 200 having an inverted conical or inverted truncated conical structure in which an upper diameter is greater than a lower diameter may be formed by anisotropically etching the substrate 100 in such a way that a width decreases from a top toward a bottom.

However, the shape of nanowire 200 is not limited thereto, and difference between the upper diameter and the lower diameter can be variously changed by changing an etch rate and selectivity. In addition, a standing angle can be changed by adjusting a gradient of the sidewall of the nanowire 200.

Here, when the standing angle is smaller than 15° which is a critical angle for total reflection of light, incident sunlight is scattered to the outside of the nanowire 200. Accordingly, the sidewall of the nanowire 200 may be preferably designed to have a gradient of a critical angle or more so as to generate total reflection of light. Accordingly, an angle that the sidewall of the nanowire 200 forms with the horizontal plane is preferably selected from the range of about 15° to 90°.

Meanwhile, the upper and lower diameters of each nanowire 200 are preferably selected from the range of 5 nm to 1 μm in order to fabricate a nano-scale device. In addition, an interval between the plurality of nanowires 200 is preferably selected from the range of 15 nm to 10 μm.

Figure 6D:
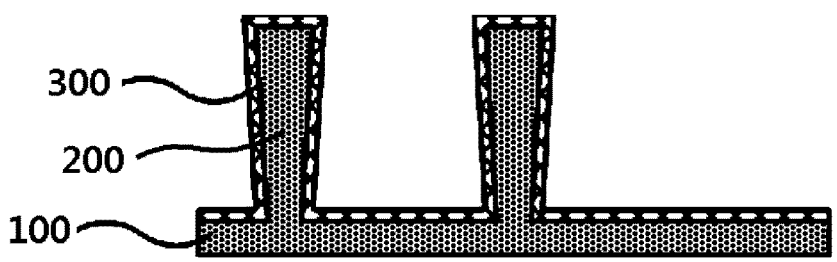

Referring to FIG. 6D, an n-type semiconductor layer 300 is formed on the p-type semiconductor layer 200 along surfaces of the plurality of nanowires 200. The n-type semiconductor layer 300 may be a silicon layer doped with n-type impurities. The n-type semiconductor layer 300 may be formed by a deposition or ion-injection process. The n-type semiconductor layer 300 is preferably formed to have a thickness of 10 nm to 500 nm.

Figure 6E:
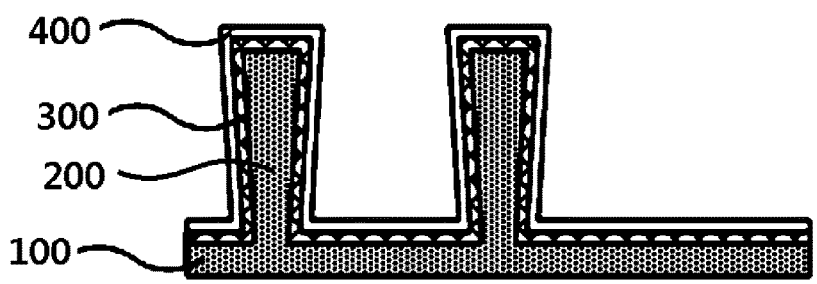

Referring to FIG. 6E, a transparent electrode layer 400 is formed on the n-type semiconductor layer 300. The transparent electrode layer 400 may be formed of a conductive material having translucence in order for more sunlight to be penerated. As an example, the transparent electrode layer 400 may be formed of at least one selected from a carbon allotrope, a transparent conductive oxide, and a metal. The transparent electrode layer 400 may be formed using thermal deposition, electron beam deposition, RF sputtering, or magnetron sputtering.

Figure 6F:
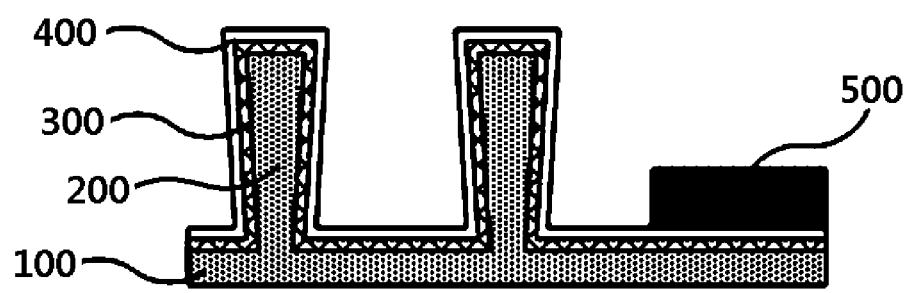
Figure 6G:
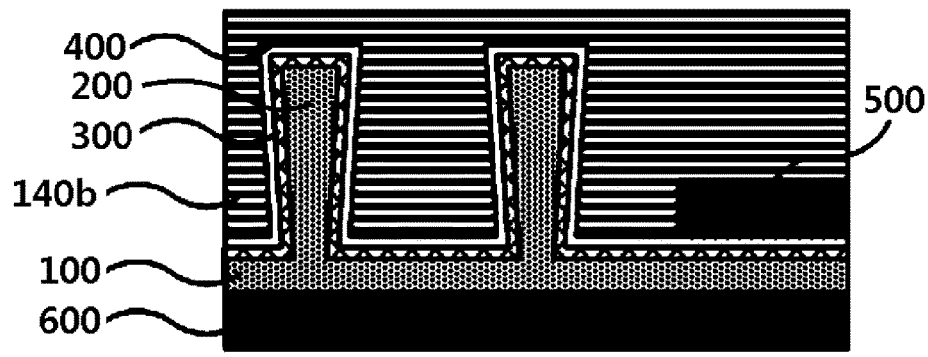

Referring to FIGS. 6F and 6G, a front surface electrode 500 may be formed on a part of the transparent electrode layer 400 so that the transparent electrode layer 400 is connected to an external circuit. In addition, a back surface electrode 600 may be formed on a back of the substrate 100 so that the p-type semiconductor layer 200 is connected to an external circuit. The electrodes 500 and 600 may be a metal having excellent conductivity, or an alloy thereof. The electrodes 500 and 600 may be formed using thermal deposition, vacuum deposition, etc. Here, photoresist 140b may be coated on the transparent electrode layer 400 in order to protect the plurality of previously formed nanowires 200 when the back surface electrode 600 is formed.

Figure 6H:
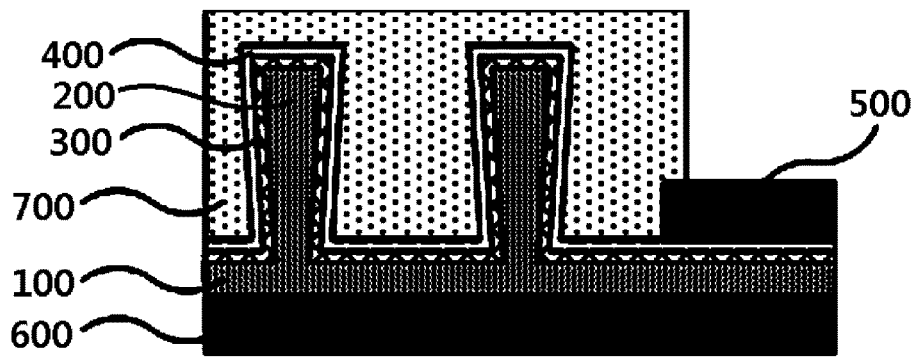

Referring to FIG. 6H, an insulating layer 700 is formed to cover the entire transparent electrode layer 400. The insulating layer 700 may fill the region between the plurality of nanowires 200, and support and fix the plurality of nanowires 200. The insulating layer 700 may be a transparent insulating layer. As an example, the insulating layer 700 may be silicon oxide layer, silicon nitride layer, or a double layer thereof. However, the present invention is not limited thereto, and any material as long as it has transparency and serves as a passivation layer can be used. The insulating layer 700 may be formed using sputtering or CVD.

Figure 7A:
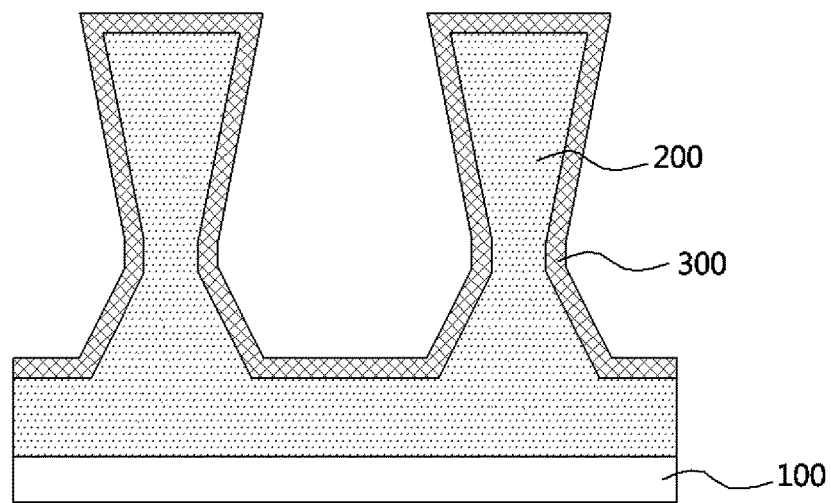
FIGS. 7A and 7B are cross-sectional views showing a nanowire in accordance with another embodiment of the present invention.
Figure 7B:
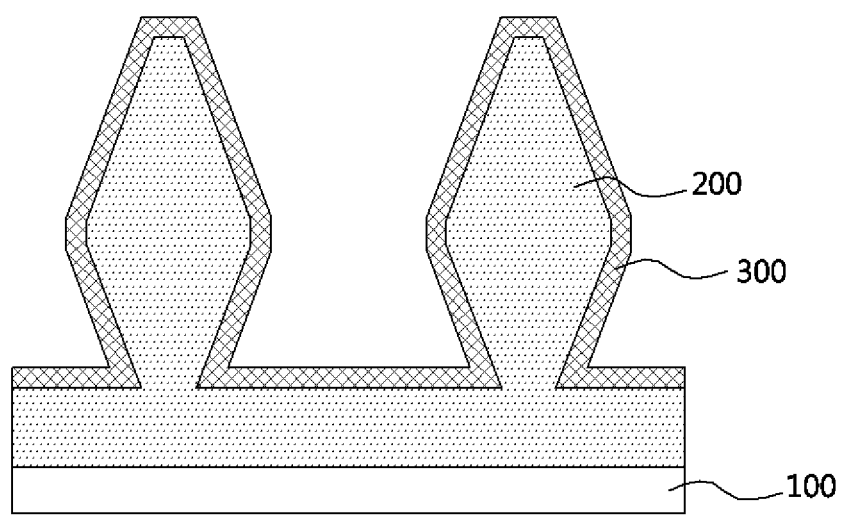

FIGS. 7A and 7B are cross-sectional views showing a nanowire in accordance with another embodiment of the present invention.

Referring to FIGS. 7A and 7B, a nanowire 200 may have a sandglass- or diamond-shaped structure in which an inverted conical or inverted truncated conical structure with an upper diameter greater than a lower diameter is combined with a conical or truncated conical structure with an upper diameter smaller than a lower diameter. The sandglass-shaped structure has a conical or truncated conical structure disposed adjacent to the substrate 100, and an inverted conical or inverted truncated conical structure disposed on the conical or truncated conical structure. On the contrary, the diamond-shaped structure has an inverted conical or inverted truncated conical structure disposed adjacent to the substrate 100, and a conical or truncated conical structure disposed on the inverted conical or inverted truncated conical structure.

Here, gradients of both sidewalls of the nanowire 200 having the sandglass-shaped or diamond-shaped structure may be changed based on a specific point.

However, the shape of the nanowire 200 is not limited thereto, and any shape of nanowire 200 as long as it has a structure using total reflection of light can be used.

Although a few embodiments have been described, it will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

The invention claimed is:

1. A solar cell, comprising:
   a substrate;
   a p-type semiconductor layer disposed on a front surface of the substrate and including a plurality of nanowires arranged to be spaced apart in a direction substantially perpendicular to the substrate; and
   an n-type semiconductor layer disposed on the p-type semiconductor layer along surfaces of the plurality of nanowires,
   wherein each of the plurality of nanowires has an inclined sidewall, and each nanowire has a portion whose diameter decreases in a direction toward the substrate.

2. The solar cell of claim 1, wherein each of the plurality of nanowires has an inverted conical or inverted truncated conical structure.

3. The solar cell of claim 1, wherein each of the plurality of nanowires has a sandglass- or diamond-shaped structure in which an inverted conical or inverted truncated conical structure with a diameter decreasing in the direction toward the substrate is combined with a conical or truncated conical structure with a diameter increasing in the direction toward the substrate.

4. The solar cell of claim 1, wherein the sidewall of each of the plurality of nanowires forms an angle of about 15° or more and less than 90° with a horizontal plane.

5. The solar cell of claim 1, wherein an interval between the nanowires is about 15 nm to 10 μm.

6. The solar cell of claim 1, further comprising a transparent electrode layer located on the n-type semiconductor layer.

7. The solar cell of claim 1, wherein the substrate and the p-type semiconductor layer are formed as a unibody structure.

8. The solar cell of claim 1, wherein the substrate and the p-type semiconductor layer contain p-type silicon.

9. A method of manufacturing a solar cell, comprising:
   providing a substrate;
   forming a p-type semiconductor layer including a plurality of nanowires having inclined sidewalls on the substrate; and
   forming an n-type semiconductor layer on the p-type semiconductor layer along surfaces of the plurality of nanowires,
   wherein each nanowire has a portion whose diameter decreases in a direction toward the substrate.

10. The method of claim 9, wherein each of the plurality of nanowires is formed to have an inverted conical or inverted truncated conical structure.

11. The method of claim 9, wherein the p-type semiconductor layer is formed as a unibody structure with the substrate by etching the substrate.

12. The method of claim 11, wherein the p-type semiconductor layer is formed to include the plurality of nanowires having inclined sidewalls by anisotropically etching the substrate.

13. The method of claim 9, further comprising forming a transparent electrode layer on the n-type semiconductor layer.

14. The solar cell of claim 1, further comprising:
   a back surface electrode disposed on a back surface of the substrate; and
   a front surface electrode disposed on the n-type semiconductor layer.

15. The solar cell of claim 1, further comprising an insulating layer formed to cover the n-type semiconductor layer and configured to fill between the plurality of nanowires.

16. The solar cell of claim 1, wherein a smallest diameter of each nanowire is between 5 to 20 nm.

17. The method of claim 9, wherein a smallest diameter of each nanowire is between 5 to 20 nm.

* * * * *